United States Patent [19]

Fadavi-Ardekani et al.

[11] Patent Number: 5,117,291
[45] Date of Patent: May 26, 1992

[54] TECHNIQUE FOR ADJUSTING SIGNAL DISPERSION CANCELLATION APPARATUS IN COMMUNICATIONS SYSTEMS

[75] Inventors: Jalil Fadavi-Ardekani, Orefield, Pa.; Jin-Der Wang, Ocean, N.J.

[73] Assignee: AT&T Bell Laboratories, Murray Hill, N.J.

[21] Appl. No.: 621,151

[22] Filed: Nov. 30, 1990

[51] Int. Cl.⁵ ............................................. H04N 5/21
[52] U.S. Cl. .................................. 358/167; 358/905; 358/187; 375/13; 333/18; 333/166
[58] Field of Search ............... 358/166, 167, 905, 187; 375/14, 13; 364/724.03, 724.2; 333/166, 18; 377/75, 76

[56] References Cited

U.S. PATENT DOCUMENTS

| | | | |
|---|---|---|---|
| 3,274,566 | 9/1966 | McGrogan, Jr. | 377/75 |
| 3,609,392 | 9/1971 | Tetik | 377/75 |
| 3,868,516 | 2/1975 | Buss | 377/76 |
| 4,021,738 | 5/1977 | Gitlin | 333/18 |
| 4,127,874 | 11/1978 | Iwasawa et al. | 358/167 |
| 4,145,747 | 3/1979 | Sakaki et al. | 364/724.2 |
| 4,314,277 | 2/1982 | Pritchard et al. | 358/167 |
| 4,404,600 | 9/1983 | Murakami | 358/167 |
| 4,431,976 | 2/1984 | Voorman | 333/166 |
| 4,611,231 | 9/1986 | Kobayashi | 358/166 |
| 4,695,969 | 9/1987 | Sollenberger | 375/13 |
| 4,809,209 | 2/1989 | White | 364/724.03 |
| 4,811,360 | 3/1989 | Potter | 364/724.2 |
| 4,941,049 | 7/1990 | Citta | 358/187 |
| 4,980,767 | 12/1990 | Chao et al. | 358/905 |
| 4,985,902 | 1/1991 | Gurcan | 333/18 |
| 5,047,859 | 9/1991 | Koo | 358/187 |

FOREIGN PATENT DOCUMENTS 0238377 9/1989 Japan .

Primary Examiner—Victor R. Kostak
Assistant Examiner—Jeffrey S. Murrell
Attorney, Agent, or Firm—David R. Padnes

[57] ABSTRACT

A technique for generating the tap-weight coefficients for a signal dispersion cancelling filter utilizes circuitry which is responsive to received signal samples and generates a time-ordered sequence of derived signal samples. The tap-weight coefficient circuitry includes filters which operate in response to this sequence. One such filter is responsive to the derived signal samples in a first portion of the sequence after the time-order of the derived signal samples therein is reversed and another filter is responsive to the derived signal samples in a second predetermined portion of the sequence. This technique is applicable to a variety of communications systems including television and is particularly suitable for integrated circuit implementation.

19 Claims, 5 Drawing Sheets

TECHNIQUE FOR ADJUSTING SIGNAL DISPERSION CANCELLATION APPARATUS IN COMMUNICATIONS SYSTEMS

TECHNICAL FIELD

The present invention relates to a signal dispersion compensation technique and, more particularly, to a technique which adjusts the operation of signal dispersion cancellation apparatus for improved performance.

BACKGROUND OF THE INVENTION

Signal dispersion, such as echoes, ghosts, multipath and intersymbol interference, is an ever-present reality in communications systems. The severity of this problem varies with the system application and, at times, can render a system completely inoperative. For example, signal ghosts or echoes at levels which are merely objectional to the viewer of a conventional television signal can render a high-definition television (HDTV) signal unintelligible. Accordingly, the cancellation or compensation for such dispersion cannot be ignored.

In order to cancel or compensate for signal dispersion, certain information about the transmission channel is required. Such information is referred to as a characterization of the transmission channel. Several techniques to characterize a dispersive transmission channel are known. These techniques basically utilize circuitry which processes samples of the received signal to generate a waveform from which characteristics or the impulse response of the dispersive transmission channel can be readily determined.

Present techniques to cancel signal dispersion further include the use of filters or equalizers whose tap-weight coefficients are adjusted to optimally cancel signal dispersion. While a variety of filters are known, two commonly known filters are finite impulse response (FIR) and infinite impulse response (IIR) filters. By definition, an FIR and an IIR filter are, respectively, filters whose time-domain responses are respectively finite and infinite. Such filters are also referred to as having a reciprocal relationship when they are arranged so that the frequency response of one is the reciprocal of the other.

A variety of techniques for adjusting FIR and IIR filters are also known. These include the least-mean-squared (LMS) algorithm, and the combination of fast Fourier transform (FFT) and inverse fast Fourier transform (IFFT) algorithms. While these techniques provide satisfactory results, they are complex and require arithmetic precision that render them not particularly suitable for implementation in large-scale integrated (LSI) circuits. Moreover, the cost, size, and power consumption requirements of such an implementation are impractical in certain system applications, such as television transmission. Accordingly, it would be desirable if a technique for adjusting signal dispersion apparatus could be developed which could provide the requisite precision and yet be readily implementable in an integrated circuit.

SUMMARY OF THE INVENTION

Broadly speaking, the present invention provides the required tap-weight coefficients for a signal dispersion filter using circuitry which is responsive to received signal samples and generates a time-ordered sequence of derived signal samples therefrom. The tap-weight coefficient-generating circuitry includes filters which operate in response to this sequence. One such filter is responsive to one portion of this sequence and another filter is responsive to another portion of this sequence, that portion having the time-order of the signal samples therein reversed. The above-described scheme can be readily implemented in an integrated circuit and, while applicable to a variety of communications systems, is particularly desirable for canceling ghosts in television signals.

DETAILED DESCRIPTION

Figure 1:
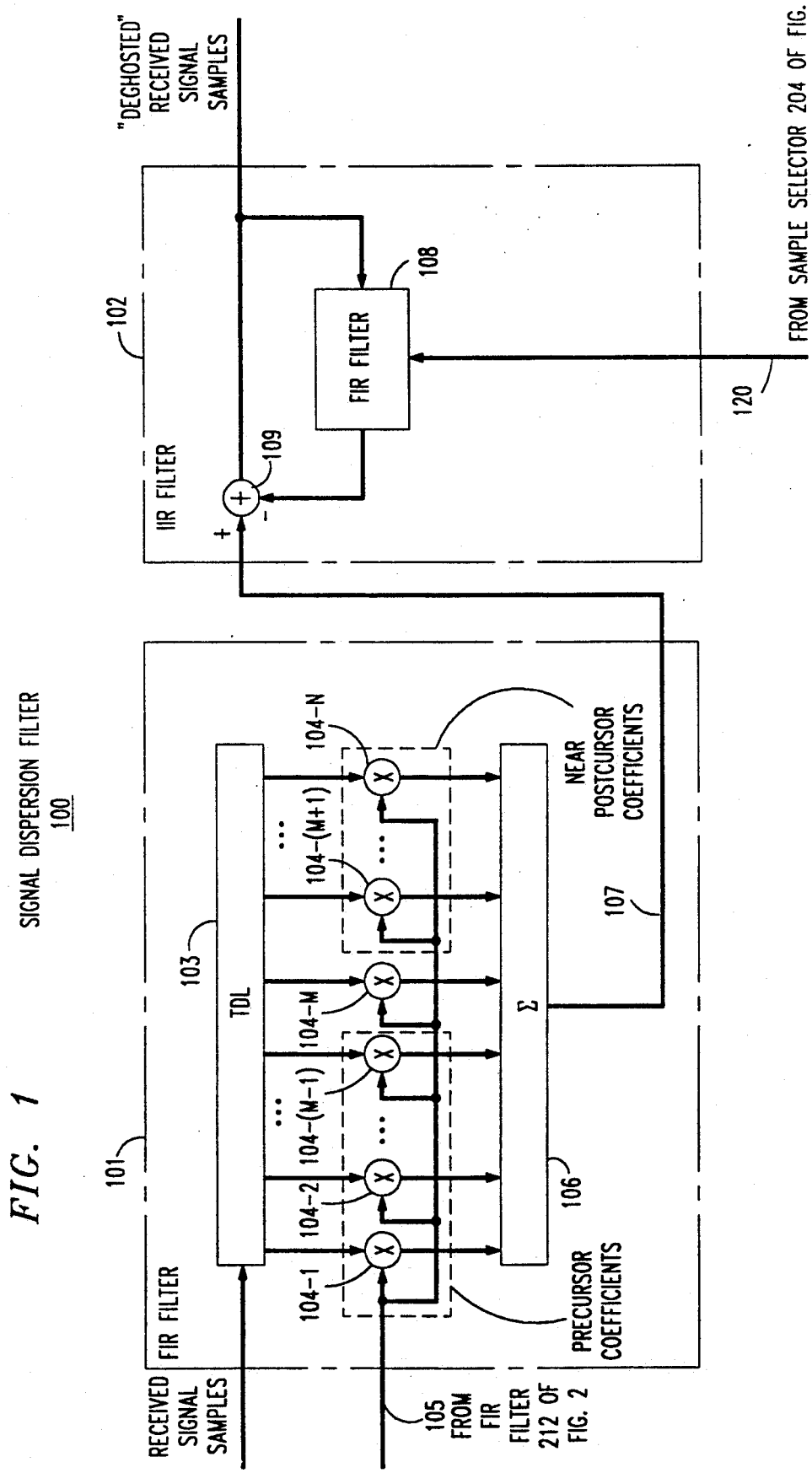
FIG. 1 is an exemplary cascaded filter which is operative with an adjustment technique pursuant to the present invention.

FIG. 1 shows an illustrative signal dispersion canceling filter 100 for use with the present invention. Filter 100 includes an FIR filter 101 and an IIR filter 102 in cascade. The FIR filter, connected to receive samples of a received signal, includes a tapped delay line 103 into which such samples are successively stored and forwarded therethrough. The sample stored in each separate storage location or "tap" is respectively associated with a different one of N multipliers or tap-weight coefficients designated as 104-1 through 104-N, where N is a predetermined integer. One of the multipliers is referred to as the main tap multiplier and in FIG. 1 this multiplier is designated as 104-M, where M is less than or equal to N. The main tap multiplier corresponds to the directly received, non-dispersed transmitted signal and need not be at the exact center of the tapped delay line.

Each multiplier forms the product of its associated received signal sample and an associated tap-weight coefficient which is supplied via bus 105. The products formed by the N multipliers are coupled to summer 106 which couples its output to lead 107. As will be discussed, each tap-weight coefficient has a value which is determined, in accordance with the present invention, so that the FIR filter 101 optimally removes a specific type of signal dispersion.

IIR filter 102, which receives the output of FIR filter 101, includes an FIR filter 108 and a combiner 109 which subtracts the output of FIR filter 108 from the signal on lead 107. FIR filter 108 can be structurally indentical to FIR filter 101. The output of combiner 109, in turn, is coupled to the input of FIR filter 108.

The present invention can be applied to virtually any communications system including conventional television systems, e.g., National Television System Committee (NTSC), Phase Alternation Line (PAL), Sequence Electronique Couleur Avec Memoire (SECAM), and HDTV. In such television applications, filters 101 and 102 serve to cancel ghosts or echoes. Ghosts, as is well-known, may be categorized as being either precursor or postcursor. A precursor ghost is one that precedes its associated transmitted signal while a postcursor ghost is one that succeeds its associated transmitted signal. In the disclosed signal dispersion canceling filter of FIG. 1, filter 100 is functionally partitioned with respect to ghost cancellation in a specific manner. In particular, one portion of FIR filter 101 substantially cancels precursor ghosts while another portion of FIR filter 101 substantially cancels "near" postcursor ghosts. On the other hand, FIR filter 108 within IIR filter 102 substantially cancels "far" postcursor ghosts altered by FIR filter 101 and residual ghosts generated by incomplete precursor and "near" postcursor ghost cancellation in FIR filter 101. Such incomplete cancellation arises in any practical implementation. The designations "near" and "far" with respect to postcursor ghosts refer to the temporal relationship between a postcursor ghost and the associated transmitted signal. A postcursor ghost which succeeds its associated transmitted signal by less than a predetermined time interval is "near" and one which succeeds its associated transmitted signal by more than this time interval is "far".

Referring to FIG. 1, the coefficients supplied to multipliers 104-1 through 104-(M−1) substantially cancel precursor ghosts, the coefficients supplied to multipliers 104-(M+1) through 104-N substantially cancel near postcursor ghosts, and the coefficients supplied to FIR filter 108 substantially cancel far postcursor and residual ghosts. While the structure of FIR filter 108 can be identical to that for FIR filter 101, the number of coefficients and multipliers N can differ. As is well-known, the greater the extent of cancellation required by a filter, the greater the number of taps. Therefore, if far postcursor ghost cancellation is not desired, IIR filter 102 can be eliminated. Or, if precursor or near postcursor ghost cancellation is not desired, FIR filter 101 can be eliminated. Similarly, the portion of FIR filter 101 associated with the cancellation of precursor or near postcursor ghosts can be eliminated if the cancellation of either one of these ghosts is not desired.

Before going into the detailed discussion of the disclosed embodiments, we will explain some basic concepts of the present invention by using some mathematical expressions.

The channel impulse response, $H(z)$, can be represented using the well-known z transform as $$H(z) = \ldots + az^m + 1 + bz^{-n} + cz^{-f} + \ldots \quad (1)$$

In Equation (1), the unity term represents the main or directly-received, non-dispersed transmitted signal and each of the other terms represents an element of the channel impulse response. The exponent of each of these elements, e.g., $m$, $-n$, $-f$, represents its time displacement relative to the main signal and each factor, e.g., $a$, $b$, $c$, denotes the amplitude of its associated element. For purposes of illustration, Equation (1) can be truncated to a four-term expression and written as $$H(z) = az^m + 1 + bz^{-n} + cz^{-f} \quad (2)$$

The present invention generates the tap-weight coefficients for FIR filter 101 and IIR filter 102 (or equivalently FIR filter 108) of the signal dispersion canceling filter using Equation (2). In Equation (2), $az^m$ and $bz^{-n}$ are respectively a precursor ghost and a near postcursor ghost and $cz^{-f}$ is a far postcursor ghost. In order to optimally cancel the signal dispersion, the factors for the inverse of $H(z)$ in Equation (2) must be determined; such factors are the tap-weight coefficients required by signal dispersion filter 100. The tap-weight coefficients of FIR filter 101 can be found by inverting $az^m + 1 + bz^{-n}$ as this expression represents the portion of the channel impulse response associated with the precursor ghost, the main signal, and the near postcursor ghost. The inverse of this portion of the channel impulse response can be written as $$\frac{1}{az^m + 1 + bz^{-n}} = \sum_{i=0}^{\infty} (-az^m - bz^{-n})^i \quad (3)$$

$$= 1 - az^m - bz^{-n} + a^2 z^{2m} + 2ab z^{m-n} + b^2 z^{-2n} - \ldots$$

In a practical implementation, the number of taps and, hence, the number of tap-weight coefficients in an FIR filter must be limited. Therefore, the number of terms in Equation (3) must be truncated as these terms correspond on a one-to-one basis with the FIR filter tap-weight coefficients.

If factors $a$ and $b$ are both zero, the far postcursor ghost, $cz^{-f}$, can be canceled by IIR filter 102 with a tap-weight coefficient $c$ at the $f^{th}$ delay element in the tapped delay line of FIR filter 108. If either factor $a$ or $b$ is non-zero, $cz^{-f}$ is altered by FIR filter 101. The tap-weight coefficients of FIR filter 108 are equal to the causal part of the output that would result if the channel impulse response were coupled to the input of an FIR filter whose tap-weight coefficients are determined by Equation (3). In a z transform, the causal part is those terms having a negative exponent.

Assuming that factor $a = 0$, Equation (3) can be implemented using an IIR filter with a tap-weight coefficient $b$ in the $n^{th}$ delay element of the tapped delay line. Moreover, the output of this IIR filter is the desired tap-weight coefficients for FIR filter 101 in signal dispersion filter 100.

Assuming that factor $b = 0$, and the portion of the channel response denoted as $az^m + 1$ is time-reversed, Equation (3) can be implemented using an IIR filter with a tap-weight coefficient $a$ in the $m^{th}$ delay element of the tapped delay line. Time reversal means that the term $z^m$ is replaced by $z^{-m}$ so that the channel response portion $az^m + 1$ becomes $1 + az^{-m}$. The time reversed output of this IIR filter is the desired tap-weight coefficients for FIR filter 101 in signal dispersion canceling filter 100.

If both factors $a$ and $b$ are nonzero, which is the usual case, the tap-weight coefficients of signal dispersion filter 100 corresponding to the precursor ghost portion of the channel response, $az^m$, can be found by assuming that factor $b = 0$. The tap-weight coefficients of signal dispersion filter 100 corresponding to the near postcursor ghost portion of the channel response, $bz^{-n}$, can be found by assuming that factor $a = 0$. The tap-weight coefficients determined by first assuming that factor $a = 0$ and factor $b$ is nonzero and vice versa are then combined together in time-order except that one of the two resulting samples corresponding to the main signal, i.e., the unity term, is discarded.

Figure 2:
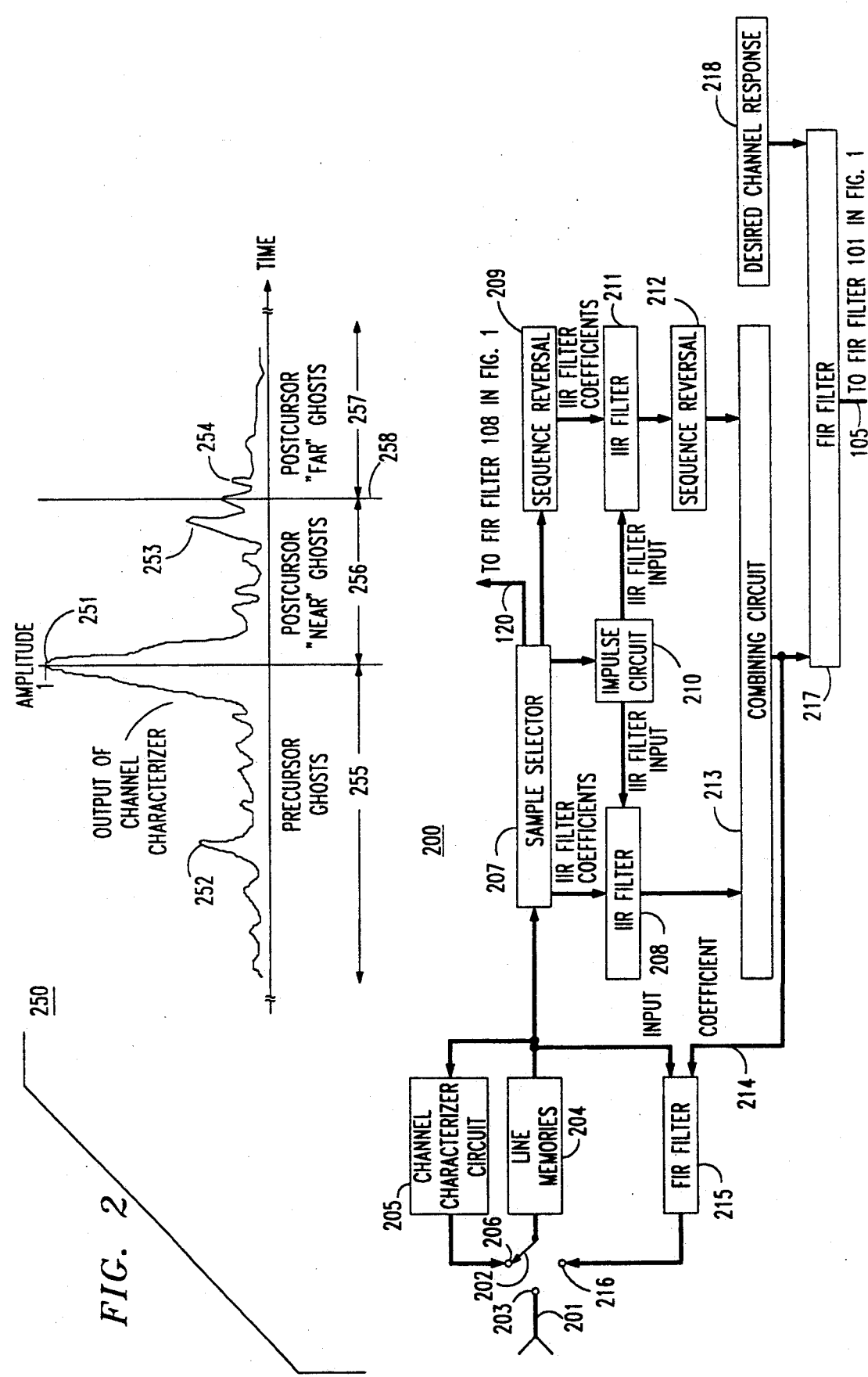
FIG. 2 is a block-schematic diagram of circuitry for adjusting the filter structure of FIG. 1 in accordance with a first embodiment of the present invention.

Refer now to FIG. 2 which shows tap-weight coefficient generating circuit 200 for the FIR and IIR filters of FIG. 1 in accordance with one embodiment of the present invention. Referring to FIG. 2, lead 201 couples the received signal samples which are supplied to filter 100 during at least one predetermined time interval. This predetermined time interval may be that coinciding with the transmission of one or more training sequences. Each such training sequence includes at least one a priori known signal, and in a television application such training sequences may be transmitted during the verical blanking interval.

During the predetermined time interval, switch 202 is connected to terminal 203 to couple the training sequence samples to line memories 204 for storage. After such storage, these samples are read out and coupled through channel characterizer circuit 205. After processing by circuit 205, switch 202 is toggled to terminal 206 to couple the processed training sequence samples back into line memories 204.

Channel characterizer circuit 205 provides output signal samples from which the characteristics of the transmission channel can be determined. The transmission channel is the signal path through which the received signal has propagated. The characterizer circuit can take a variety of forms. For example, if the training sequence is a pseudorandom sequence or one of its variants, as disclosed in pending applications Ser. No. 443,772 (Chao 1-23-4) abandoned June 25, 1990, Ser. No. 494,941 (Chao 2-24-7 continuatin-in-part) now U.S. Pat. No. 4,980,767 dated Dec. 25, 1990, and Ser. No. 493,017 (Wang 6) abandoned Aug. 12, 1991, respectively filed on Nov. 30, 1989, Mar. 14, 1990 and Mar. 13, 1990, all assigned to the present assignee, the channel characterizer circuit is a correlator which detects the training sequence and generates a time-ordered sequence of signal samples representative of the waveform designated as 250 in FIG. 2. Alternatively, if the training sequence is an integrated sin x/x sequence, the characterizer circuit includes a differentiator and an averager which provide a time-ordered sequence of signal samples representative of a waveform substantially similar to that of waveform 250.

Referring to waveform 250, the main peak 251 represents the channel characterizer circuit's response to the detection of the transmitted training sequence which has directly propagated without dispersion to circuit 200. It is assumed that channel characterizer circuit 205 provides a normalized response such that the amplitude of the main peak 251 is unity. The surrounding, substantially smaller peaks, such as 252, 253, and 254, repectively represent precursor, near postcursor and far postcursor ghosts. Sample selector 207 receives the time-ordered sequence of signal samples representative of waveform 250 and extracts the samples lying in distinctive predetermined time intervals or "windows" and the sample representative of main peak 251. In this disclosed embodiment of the present invention, the samples coupled to IIR filter 208 are those time-ordered samples lying in time interval 256, the time-ordered samples coupled to sequence reversal circuit 209 are those lying in time interval 225, and the sample representative of main peak 251 is coupled to and stored in impulse circuit 210.

Sequence reversal circuit 209 receives the ordered sequence of samples lying in time interval 255 and outputs these samples in reverse time-order. Reversing the time-order means that for a time-ordered sequence of p samples $S_1, S_2 \ldots S_p$, the reversed time-ordered sequence is $S_p \ldots S_2, S_1$.

IIR filters 208 and 211, each having a substantially identical structure to that of IIR filter 102 of FIG. 1, respectively receive the samples lying in time intervals 256 and 255, the latter being in time-reversed order. IIR filters 208 and 211 also each receive a sample whose unity amplitude corresponds to main peak 251 from impulse circuit 210. This sample is used as an input signal for each IIR filter.

The output signal provided by IIR filter 211 is a time-ordered sequence which is time reversed by sequence reversal circuit 212, the latter operating in a similar manner to sequence reversal circuit 209. Combining circuit 213 combines the outputs provided by IIR filter 208 and sequence reversal circuit 212 in algebraic fashion such that the output of circuit 212 is followed in time by the output of IIR filter 208 except for the first sample which is eliminated. This elimination of the first sample at the output of IIR filter 208 accounts for the fact that the first samples from filter 208 and circuit 212 correspond to the main signal and have the same value as 1.

The generation of the tap-weight coefficients for the FIR filter 108 in IIR filter 102 is derived from the factors provided by the output of combining circuit 213. Referring to FIG. 2, such derivation uses FIR filter 215 to convolve these factors on bus 214 and the samples representative of waveform 250 stored in line memories 204. Once this processing is accomplished, switch 202 is toggled to terminal 216 to couple the output of FIR filter 215 into line memories 204. This stored filter output is then supplied to sample selector 207 which now eliminates the filter output corresponding to time intervals prior to and including main pulse 251 and couples the remaining signal samples to FIR filter 108 of FIG. 1 via bus 120. In certain applications, of course, sample selector 207 could eliminate the FIR filter 215 output corresponding to time intervals prior to any predetermined time instant, such as 258.

To generate the tap-weight coefficients for FIR filter 101, FIR filter 217 convolves the output of combining circuit 213 with a set of desired channel response filter coefficients provided by circuit 218. The output provided by FIR filter 217 is the set of coefficients for FIR filter 101 in FIG. 1. These coefficients are coupled to filter 101 via bus 105.

The desired set of coefficients provided by circuit 218 varies with the system application but, in general, is that set of filter coefficients which provides an a priori chosen response of the communications channel. One such desired response is that corresponding to a "flat", i.e., non-attenuating, signal response. Other such responses can be any predetermined signal shaping. Of course, if the desired response is a unit impulse response, then FIR filter 217 and circuit 218 can be eliminated and the tap-weight coefficients for FIR filter 101 are provided by the output of combining circuit 213.

To better understand the need for filter 217 and circuit 218, it should be recognized that filter 100 provides an impulse response which is basically the inverse of the channel impulse response. By inverting the channel impulse response, the transfer function at the output of signal dispersion filter 100 is a unit impulse response. Depending on system applications, a different desired response might be needed. If the desired channel response is other than a unit impulse response, the set of coefficients obtained for FIR filter 101 to invert the channel should be convolved with this desired channel response to obtain the set of tap-weight coefficients for FIR filter 101. On the other hand, the set of tap-weight coefficients generated for FIR filter 108 of IIR filter 102 remains unchanged. The reason can be explained by the following mathematical expression wherein the channel impulse response is divided into two parts so that $$H(z) = G_n(z) + 1 + G_f(z), \quad (4)$$

where $G_n(z)$ corresponds to the precursor and near postcursor response, and $G_f(z)$ corresponds to the far postcursor response. The desired channel response is $kD(z)$ where k is a scalar. The FIR filter 101 approximates the response $kD(z)/(1+G_n(z))$. Therefore, the output of FIR filter 101 has a response of $kD(z)(1+G_f(z)/(1+G_n(z)))$. Since the desired response at the output of combiner 109 is $kD(z)$, to emulate the far ghost at the input of combiner 109, FIR filter 108 should have coefficients of $G_f(z)/(1+G_n(z))$.

A problem with the embodiment shown in FIG. 2 is that the interaction between the channel response elements, such as the term $2abz^{m-n}$ in Equation (3), is ignored. However, this embodiment provides good results under either of the following conditions: 1) ghosts in the channel have a small magnitude, or 2) only postcursor ghosts exist, or 3) only precursor and far postcursor ghosts exist. The embodiment shown in FIG. 3 will take this interaction into account, and therefore is applicable for any combination of ghosts. The circuit operation of FIG. 3 is conceptually similar to that described in reference to FIG. 2, except that an iterative scheme is utilized, as will be hereinafter described, to account for interaction between the channel response elements.

Figure 3:
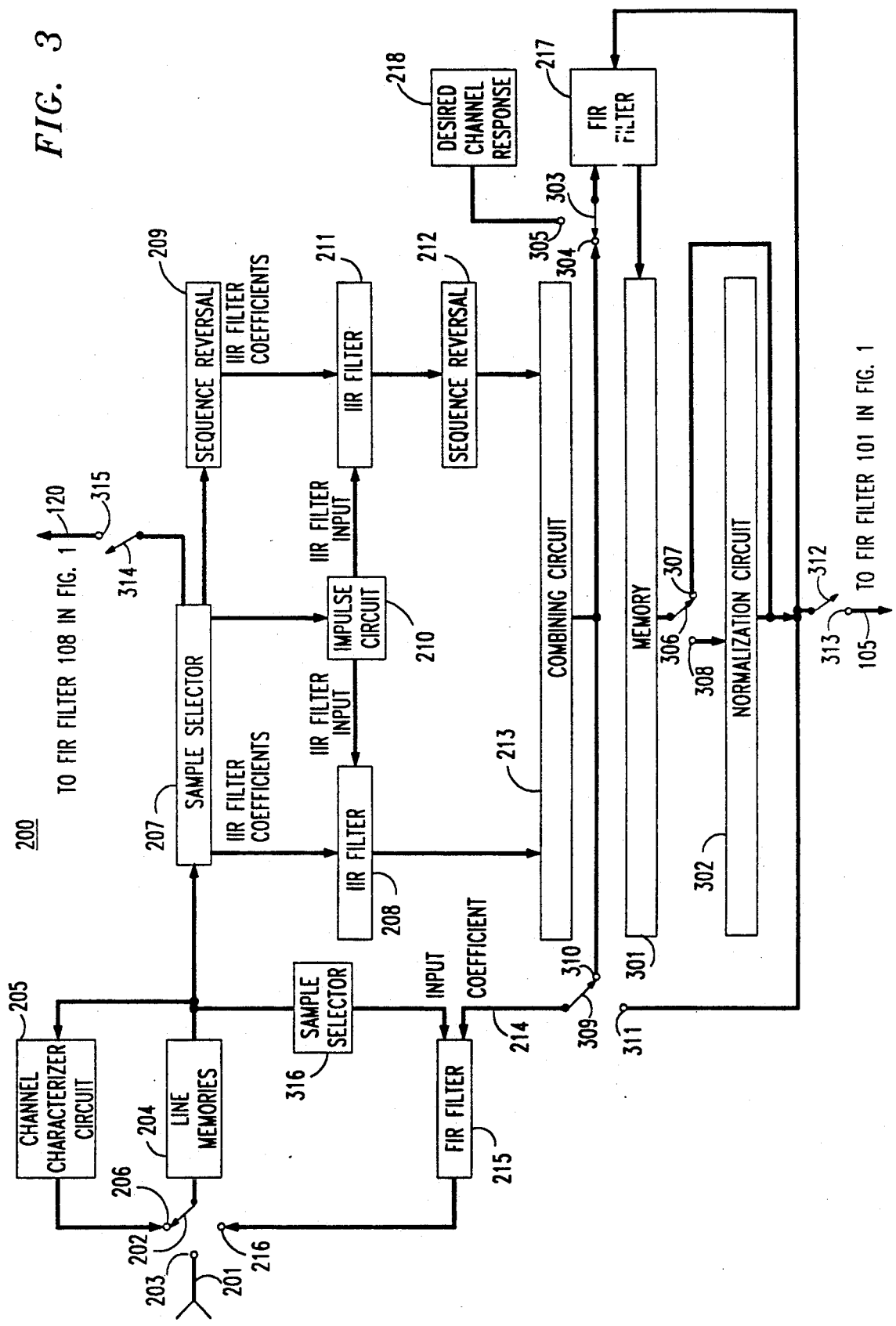
FIG. 3 is a block-schematic diagram of circuitry for adjusting the filter structure of FIG. 1 in accordance with a second embodiment of the present invention.

Refer now jointly to FIGS. 2 and 3. The embodiments of FIGS. 2 and 3 share a number of circuit elements that function in the same manner and each of these "shared" elements is denoted by the same reference numerals in both these embodiments. These shared elements include switch 202, line memories 204, channel characterizer circuit 205, sample selector 207, IIR filters 208 and 211, sequence reversal circuits 209 and 212, impulse circuit 210 and combining circuit 213. FIG. 3 also utilizes additional circuit elements which include memory 301, normalization circuit 302, switches 303, 306, 309, 312 and 314, and sample selector 316.

Initially, switches 303, 306 and 309 are respectively toggled to terminals 304, 307 and 310. The processing of the received signal samples by the above-described, commonly-shared circuit elements generates a first output of combining circuit 213. Unlike the operation of the circuitry of FIG. 2, this first combining circuit output will not be used to directly determine the tap-weight coefficients of signal dispersion canceling filter 100. Instead, the first output is used as the tap-weight coefficients of FIR filter 215 to process the content of line memories 204. The result of this processing is then stored in line memories 204 and a selected portion is then coupled to the shared elements via sample selector 207. These shared elements generate another combining circuit output. The first combining circuit output is also processed via FIR filter 217 using an initial set of coefficients stored in memory 301 to generate an updated set of coefficients. This updated coefficient set is then stored in memory 301 and replaces the previously-stored coefficient set.

The iterative process can be repeated a predetermined number of times wherein in each cycle the combining circuit output is reprocessed to both update the contents of memory 301 and generate another combining circuit output. In general, three or four iterations are sufficient for most practical applications. The details of this iterative process will now be described in more detail.

Refer now to FIG. 3. After combining circuit 213 generates a first output in the manner described in reference to FIG. 2, this first output is coupled through switches 303 and 309 to FIR filters 217 and 215, respectively. Filter 215 convolves this first output with a time-ordered sequence of signal samples provided by sample selector 316. Selector 316 provides a sequence of time-ordered samples representative of waveform 250 of FIG. 2 time intervals 255 and 256 including main peak 251. Far postcursor ghosts are not included until the last iteration when samples representative of waveform 250 in time intervals 255, 256 and 257, including main peak 251, are utilized. The output of FIR filter 215 for each iteration is regarded as an intermediate channel response, is stored in line memories 204, and is used as an input to sample selector 207 for the next iteration. The output of FIR filter 215 is coupled to line memories 204 and stored therein by toggling switch 202 to terminal 216. The first output of combining circuit 213 is also convolved with a set of coefficients stored in memory 301 via FIR filter 217. This initial set of coefficients is a unity coefficient followed by zero coefficients. The output provided by FIR filter 217 is written into memory 301 and replaces the initially-stored coefficient set. This is the end of the first iteration.

In the next iteration, the intermediate channel response stored in line memories 204 is processed in the same manner as the first combining circuit output to generate the next combining circuit output. This next combining circuit output is then convolved with the samples provided by selector 316 of the intermediate channel response stored in line memories 204 in the immediately preceding iteration to generate a new intermediate channel circuit response. This new intermediate channel response then replaces the previously-stored intermediate circuit response. In addition, FIR filter 217 convolves this next combining circuit output with the coefficients stored in memory 301 to generate a new set of coefficients which are stored in memory 301 and replace the currently-stored coefficient set.

Once this iterative process has been performed the predetermined number of times, the tap-weight coefficients of FIR filter 102 and FIR filter 108 are finalized. This finalization involves the use of FIR filter 215 to convolve the last generated combining circuit output with the portion of the currently stored intermediate channel response in line memories provided by sample selector 316. The results of this operation are coupled through sample selector 207 which provides an output only to impulse circuit 210. There is no output coupled to IIR filter 208 or sequence reversal circuit 209. The output to impulse circuit 210 will be later utilized by normalization circuit 302.

Switches 303, 306 and 309 now respectively toggle to terminals 305, 308 and 311. The stored set of coefficients in memory 301 is coupled through normalization circuit 302 which multiplies the received coefficient set by the reciprocal of the last sample value received by impulse circuit 210. Such normalization is advantageously used for gain adjustment purposes. The output of normalization circuit 302 is coupled to FIR filter 215 wherein the coefficients of FIR filter 108 are generated in the same manner as in FIG. 2. Specifically, this generation involves convolving the normalization circuit output with the samples representative of waveform 250 which are stored in line memories 204 and coupled to FIR filter 215 via sample selector 316. The output of FIR filter 215 is stored in line memories 204, passed through sample selector 207 to eliminate the samples corresponding to time intervals prior to and including main pulse 251, and then provided to FIR filter 108 via the closing of switch 314 to terminal 315.

To generate the tap-weight coefficients of FIR filter 101, the normalization circuit output is also coupled to FIR filter 217 which now convolves this output with the desired channel response provided by circuit 218. The results of this filter operation are stored in memory 301 and then coupled to bus 105 via the respective toggling of switches 306 and 312 to terminals 307 and 313.

In either of the embodiments of FIGS. 2 and 3, if the coefficients provided to FIR filter 101 and FIR filter 108 of FIG. 1 are sparse and are spread over a wide range in time, they can be thresholded. The coefficients smaller than a thresholding value are discarded. Therefore, many hardware multipliers in FIR filter 101 and FIR filter 108 can be eliminated.

The embodiments of FIGS. 2 and 3 provide satisfactory results for systems in which the received signal samples on lead 201 have been sampled at a rate which is less or equal to twice the channel transmission bandwidth. However, if the sampling rate is higher than twice the channel transmission bandwidth, some of the filtering procedures utilized may become unstable. This instability arises because a certain frequency region of the oversampled channel impulse response has no energy or very little energy. The same problem also occurs in the combined FFT and IFT or the LMS algorithm. There is a well-known procedure for those two schemes to avoid the stability problem. Accordingly, this procedure can be incorporated in either of the disclosed embodiments. This procedure involves injecting some signal energy into the frequency region that has little or no energy. Such regions can be readily determined by well-known techniques. For example, in an illustrative NTSC television system, the sampling rate is 14.32 MHz and the transmission bandwidth is 4.2 MHz. The sampling rate is higher than twice 4.2 MHz. A response that creates energy from 4.2 MHz to 10.12 MHz should be added. This response can be easily generated by modulating a sinx/x time waveform of a proper bandwidth and strength. This signal is added to the channel impulse response before going through any processing.

Figure 4:
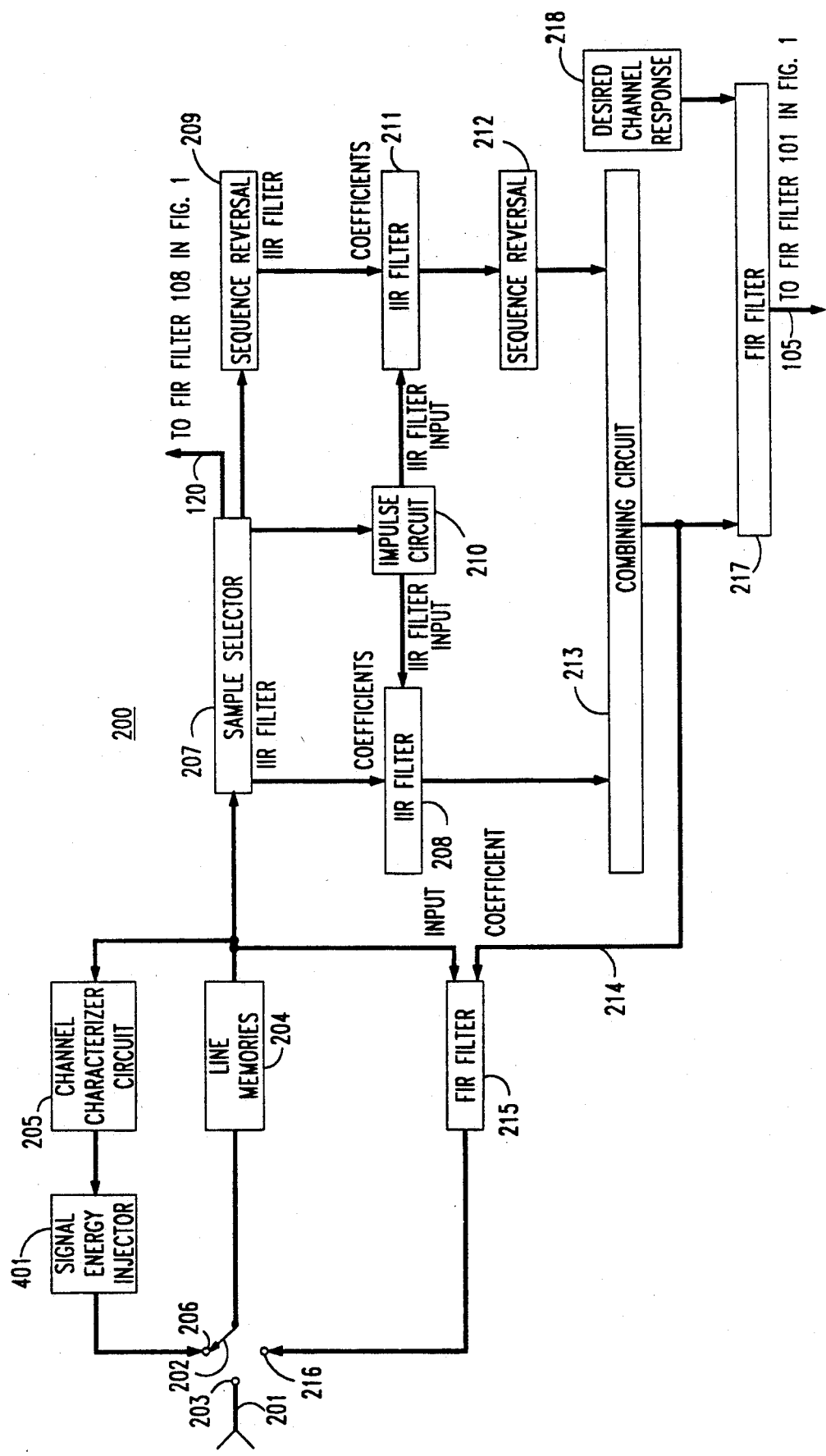
FIG. 4 is a block-schematic diagram of a variant of the first embodiment of the present invention applicable to communications systems wherein the received signal is over-sampled.
Figure 5:
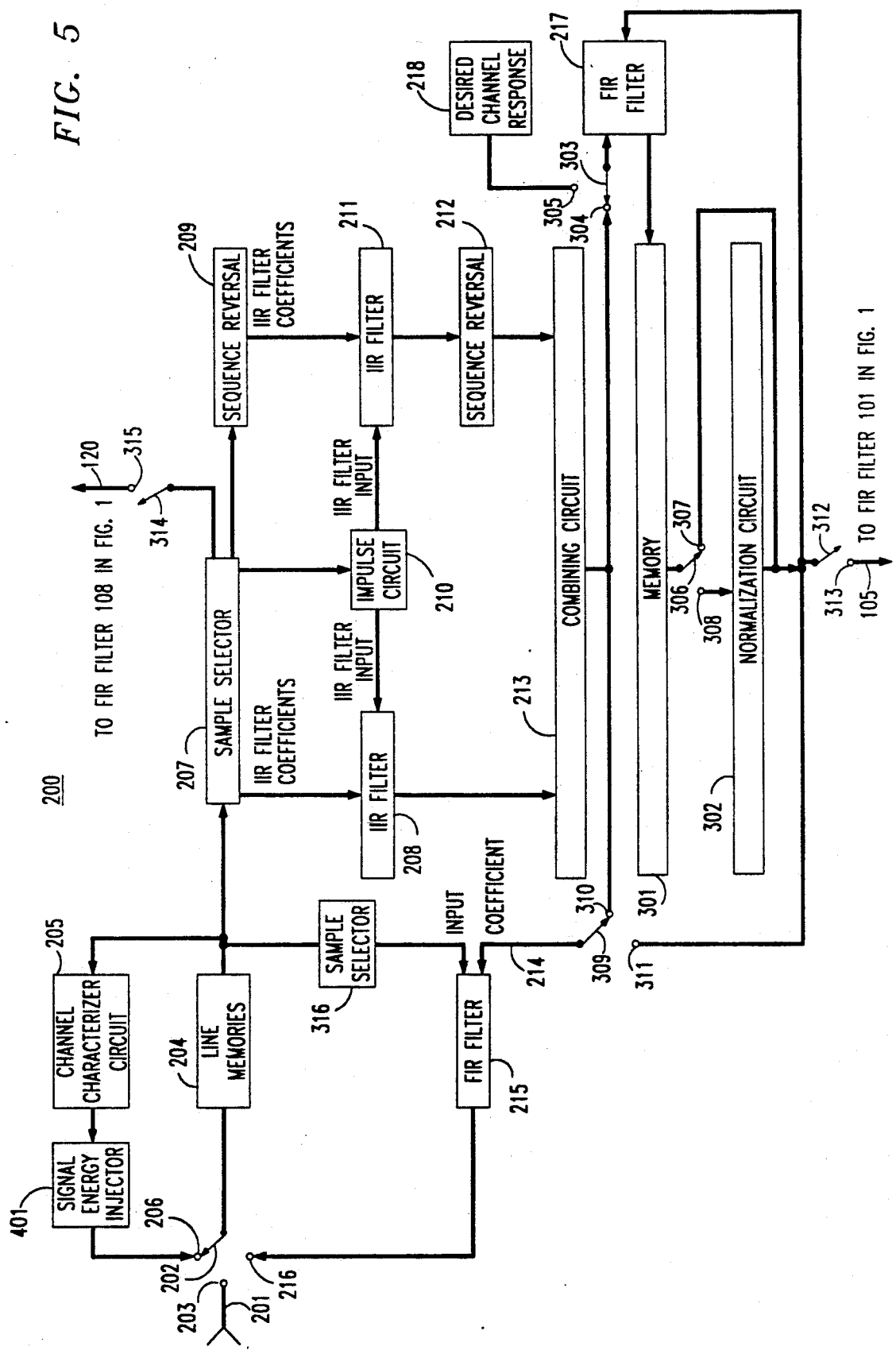
FIG. 5 is a block-schematic diagram of a variant of the second embodiment of the present invention applicable to communications systems wherein the received signal is oversampled.

Refer now to FIGS. 4 and 5 which respectively show a modification of the circuitry of FIGS. 2 and 3 which avoid instability problems by the use of signal energy injector 401 which provides samples which selectively provide signal energy in the frequency region having little or no energy. Injector 401 is disposed at the output of channel characterizer circuit 205 so that in the embodiments of FIGS. 4 and 5 the time-ordered sequence of signal samples written into line memories 204 and processed to generate the signal dispersion filter tap-weight coefficients are representative of waveform 250 with selectively added signal energy. The operation of the circuitry of FIGS. 4 and 5 is otherwise respectively identical to that of FIGS. 2 and 3.

It should, of course, be understood that while the present invention has been disclosed in reference to specific embodiments, the devices in any embodiment can be implemented using one or more appropriately programmed general-purpose processors or special-purpose integrated circuits, or digital signal processors, or an analog or hybrid counterpart of any of these devices.

In addition, numerous other arrangements should be apparent to those of ordinary skill in the art. For example, if the sampling rate of the received signal samples provided on lead 201 is an integral multiple of the transmission bandwidth, the channel response can be decimated to a sampling rate of twice the transmission bandwidth. In this case, the decimated channel impulse response can be directly processed. The resulting coefficients are then interpolated for final usage. Or, for example, if the channel impulse response has a deep null in its response which can cause a stability problem, some signal with energy over the deep null or across the whole sampling bandwidth can be added to avoid stability problems. In addition, while the disclosed embodiments developed procedures using real number operations, the same procedures are also applicable to the case where the channel impulse response and filter operations utilize complex numbers. It should be also recognized that the disclosed embodiments process a digitized analog input. The signal dispersion filter in FIG. 1 is composed of FIR filter 101 and IIR filter 102. The present invention can also be used in data communications where data symbols are transmitted at a symbol rate 1/T. In this case, a well-known apparatus (not shown) known as a decision feedback equalizer should be used. As an example, it is assumed that the received signal samples to the tapped delay line 103 are generated k times higher than the symbol rate. FIR filter 101 receives k samples at a time and sends out results of summer 106 via bus 107 once very symbol interval T. As a decision feedback equalizer, a slicer is inserted in FIG. 1 after combiner 109 and provides sliced symbols to the input of FIR filter 108. The coefficients for FIR filter 108, before they are coupled via bus 120, are resampled at a rate 1/T, or equivalently k-1 coefficients are discarded before a sample is retained. If the feedback filter is not used, FIR filter 101 performs as a well-known linear equalizer. In still another application, such as a television application, the signal dispersion canceling filter may perform on a real-time basis. The tap-weight coefficient calculation procedures provided by in disclosed embodiments can be done on an off-line basis. Therefore, filter operations of tap-weight coefficient calculation procedures can be implemented using a single multiplier and an accumulator which perform a filter operation (or convolution) in sequential fashion. The hardware complexity for tap-weight coefficient calculation is much reduced. This time-sharing of the hardware is particularly advantageous in a large-scale integrated circuit implementation.

Finally, the disclosed tap-weight coefficient generating techniques can be used for a variety of signal dispersion filters either alone or in combination with prior art coefficient generating techniques such as FFT, IFT and LMS. For example, FIR filter 101 of FIG. 1 could be adjusted using any prior art technique and IIR filter 102 could be adjusted pursuant to the present invention and vice versa.

We claim:

1. Apparatus for determining the tap-weight coefficients of a signal dispersion cancelling filter comprising
    means for processing received signal samples having dispersion and generating a time-ordered sequence of derived signal samples therefrom; and
    means for generating the tap-weight coefficients in response to the derived signal samples in a first predetermined portion of said time-ordered sequence in reversed time-order and to the derived signal samples in a second predetermined portion of said time-ordered sequence.

2. The apparatus of claim 1 wherein said tap-weight coefficient generating means is responsive to said ordered sequence of signal samples and then operates in an iterative fashion in response to signals derived from said ordered sequence of signal samples to generate said tap-weight coefficients.

3. The apparatus of claim 1 wherein said means for generating said ordered sequence of signal samples generates signal samples representative of a waveform from which characteristics of the signal-dispersive transmission channel can be determined.

4. The apparatus of claim 1 wherein said ordered sequence of signal samples generated by said first means is representative of a waveform from which characteristics the signal-dispersive transmission channel can be determined and said waveform also includes signal energy which is selectively added to said waveform.

5. The apparatus of claim 1 wherein said tap-weight coefficient generating means also includes at least one finite impulse response filter.

6. The apparatus of claim 1 wherein said tap-weight coefficient generating means includes first and second filters which are respectively responsive to said reversed time-ordered samples in said first predetermined portion and to the time-ordered samples in said second predetermined portion.

7. The apparatus of claim 6 wherein said first and second filters are infinite impulse response filters.

8. The apparatus of claim 6 wherein said first filter provides a time-ordered output and said tap-weight coefficient generation means also includes means for reversing the time-order of the first filter output.

9. The apparatus of claim 8 wherein said first filter and said reversing means each provide time-ordered outputs and said tap-weight coefficient generating means also includes means for combining such time-ordered outputs.

10. A method of determining the tap-weight coefficients of a signal dispersion cancelling filter, said method comprising the steps of
processing received signal samples having dispersion and generating a time-ordered sequence of derived signal samples therefrom; and
generating said tap-weight coefficients in response to the derived signal samples in a first predetermined portion of said time-ordered sequence in reversed time-order and to the derived signal samples in a second predetermined portion of said time-ordered sequence.

11. Apparatus for generating the tap-weight coefficients for a filter which cancels ghosts in a television signal, said apparatus comprising
means for processing received signal samples having dispersion and generating a time-ordered sequence of derived signal samples therefrom; and
means for generating the tap-weight coefficients in response to the derived signal samples in a first predetermined portion of said time-ordered sequence in reversed time-order and to the derived signal samples in a second predetermined portion of said time-ordered sequence.

12. The apparatus of claim 11 wherein said received signal samples are samples of at least one training sequence including at least one predetermined signal value.

13. The apparatus of claim 12 wherein said training sequence is transmitted during a vertical blanking interval.

14. A method of generating the tap-weight coefficients for a filter which cancels ghosts in a television signal, said method comprising the steps of
processing received signal samples having dispersion and generating a time-ordered sequence of derived signal samples therefrom; and
generating said tap-weight coefficients in response to the derived signal samples in a first predetermined portion of said time-ordered sequence in reversed time-order and to the derived signal samples in a second predetermined portion of said time-ordered sequence.

15. Apparatus for use in a digital communications system wherein dispersion is introduced during signal transmission, said apparatus comprising
means capable of cancelling signal dispersion in a received digital signal, said cancelling means being adjustable in response to different values of at least one coefficient;
means for processing received signal samples having dispersion and generating a time-ordered sequence of derived signal samples therefrom; and
means for generating the value of said coefficient which substantially cancels said signal dispersion in said received signal and providing this value to said cancelling means in response to the derived signal samples in a first predetermined portion of said time-ordered sequence in reversed time-order and to the derived signal samples in a second predetermined portion of said time-ordered sequence.

16. The apparatus of claim 15 wherein said cancelling means includes a finite impulse response filter.

17. The apparatus of claim 15 wherein said cancelling means includes an infinite impulse response filter.

18. The apparatus of claim 15 wherein said cancelling means includes a finite impulse response filter and an infinite impulse response filter in tandem.

19. A method of cancelling signal dispersion in a digital communications system, said method comprising the steps of
coupling a received signal including signal dispersion to circuitry capable of cancelling such dispersion, the cancellation provided being variable in response to different values of at least one coefficient; and
providing the value of each such coefficient which substantially cancels the dispersion by
processing samples of received signal samples having dispersion and generating a time-ordered sequence of derived signal samples therefrom; and
generating said coefficient value which substantially cancels said signal dispersion in response to the derived signal samples in a first predetermined portion of said time-ordered sequence in reversed time-order and to the derived signal samples in a second predetermined portion of said time-ordered sequence.

* * * * *